(12) United States Patent
Hong et al.

(10) Patent No.: US 7,068,198 B2
(45) Date of Patent: Jun. 27, 2006

(54) DOUBLE-SAMPLED INTEGRATOR SYSTEM AND METHOD THEREOF

(75) Inventors: Merit Y. Hong, Chandler, AZ (US); Julian G. Ashieri, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 43 days.

(21) Appl. No.: 10/857,041

(22) Filed: May 28, 2004

(65) Prior Publication Data

US 2005/0275580 A1   Dec. 15, 2005

(51) Int. Cl.
*H03M 3/00* (2006.01)
(52) U.S. Cl. ...................... 341/143; 341/172
(58) Field of Classification Search ............. 341/143, 341/172
See application file for complete search history.

(56) References Cited

U.S. PATENT DOCUMENTS

| | | | | |
|---|---|---|---|---|
| 5,563,597 A | * | 10/1996 | McCartney | 341/143 |
| 6,040,793 A | * | 3/2000 | Ferguson et al. | 341/143 |
| 6,441,762 B1 | * | 8/2002 | Angelici et al. | 341/172 |
| 6,570,519 B1 | * | 5/2003 | Yang | 341/143 |
| 6,621,438 B1 | | 9/2003 | Hong | |
| 6,744,394 B1 | * | 6/2004 | Liu et al. | 341/172 |

OTHER PUBLICATIONS

Sungkyung Park et al, "A Digital-to-Analog Converter Based on Differential-Quad Switching," IEEE Journal of Solid-State Circuits, vol. 37, No. 10, pp. 1335-1338, Oct. 2002.

Bernd Schafferer and Richard Adams, "A 3V CMOS 400mW 14b 1.4GS/s DAC for Multi-Carrier Applications," ISSCC 2004/Session 20/20.1; 2004 IEEE International Solid-State Circuits Conference, 3 pp. Feb. 2004.

Daniel Senderowicz, et al, "Low-Voltage Double-Sampled $\Sigma\Delta$ Converters," IEEE Journal of Solid-State Circuits, vol. 32, No. 12, pp. 1907-1919, Dec. 1997.

Paul J. Hurst and William J. McIntyre, "Double Sampling in Switched-Capacitor Delta-Sigma A/D Converters," 1990 IEEE, *Proc. IEEE Int. Symposium on Circuits and Systems*, pp. 902-905, May 1990.

Ivan John O'Connell and Colin Lyden, "A Novel Double Sampled Chopper Stabilised Integrator for Switched Capacitor $\Sigma\Delta$ Modulators," IEEE International Symposium on Circuits and Systems, pp. 619-622, May 2002.

* cited by examiner

*Primary Examiner*—Lam T. Mai

(57) ABSTRACT

A double-sampled feedback integrator system includes a sampling module having multiple switched capacitors. The switched capacitors of the integrator system are opened and closed based upon a polarity of the signal input to the double-sampled feedback integrator system. The integrator system can be used in a sigma-delta converter. A sigma-delta converter includes a double-sampled common-mode correction circuit having multiple switched capacitors to provide common-mode rejection to a system.

30 Claims, 4 Drawing Sheets

DOUBLE-SAMPLED INTEGRATOR SYSTEM AND METHOD THEREOF

BACKGROUND

1. Field of the Disclosure

The present disclosure relates to semiconductor devices, and more particularly to a semiconductor device comprising an integrator system.

2. Description of the Related Art

Traditional single-sampling sigma-delta modulators sample on one clock phase and integrate on the other. Since the differential amplifiers associated with the integrators of single-sampling sigma-delta modulators are only active during the integration phase, both bandwidth and power are wasted when the differential amplifiers are idle during the sampling phase. Better efficiency is obtained with double-sampling sigma-delta modulators, where sampling and integrating occur simultaneously on both phases of the clock. However, known double-sampling sigma-delta modulators suffer from either capacitor mismatch, resulting in additional quantization noise in the signal band, or hysteresis, resulting in a reduction of Signal to Noise Ratio (SNR).

A method and device reducing the affects of capacitor mismatch and reducing hysteresis would be useful.

BRIEF DESCRIPTION OF THE DRAWINGS

The present disclosure may be better understood, and its numerous features and advantages made apparent to those skilled in the art by referencing the accompanying drawings.

DESCRIPTION OF THE PREFERRED EMBODIMENT(S)

A double-sampled integrator system for use in a sigma-delta converter is disclosed. The integrator system reduces or eliminates hysteresis from the system. The present disclosure will be better understood with reference to the figures discussed herein.

Figure 1:
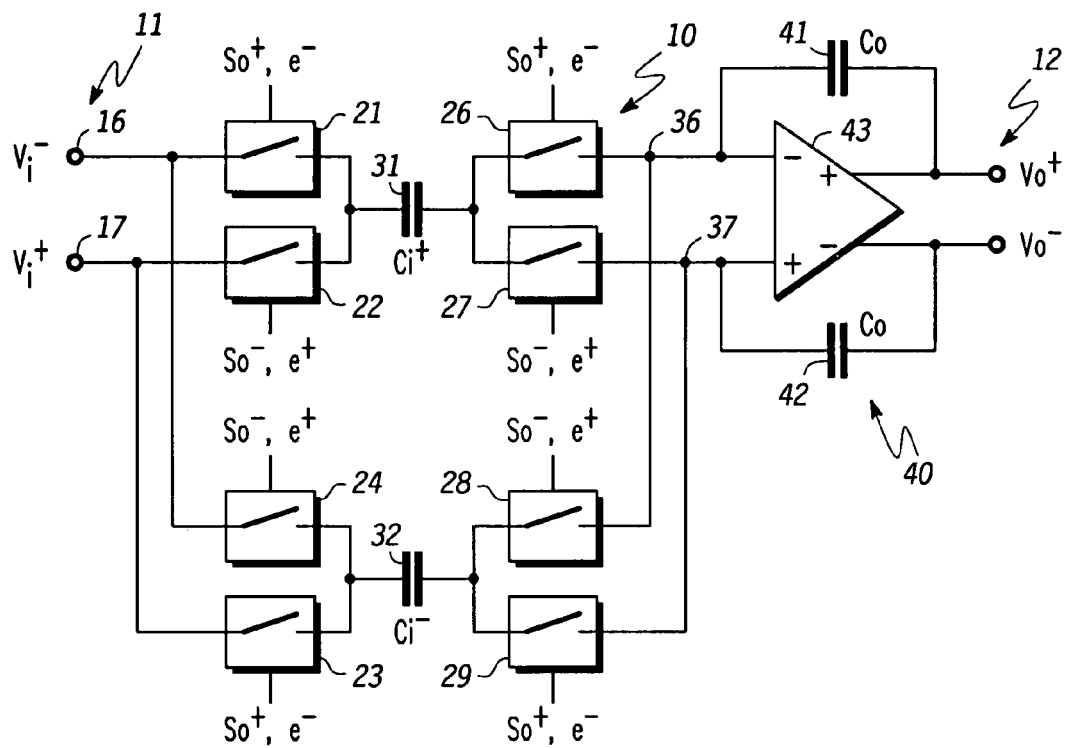
FIG. 1 is a block diagram of an integrator system having a double-sampling feedback sampling module in accordance with a specific embodiment.

FIG. 1 illustrates an integration system that can be used in a stage of a sigma-delta converter. The integration system of FIG. 1 comprises differential feedback sampling portion 10 connected to integrator 40 by differential summing nodes 36 and 37. Not specifically illustrated in FIG. 1 is a differential input sampling portion that would also be connected to the summing nodes 36 and 37.

Differential feedback sampling portion 10 further comprises differential input 11, switches 21–24 and 26–29, input capacitors 31 and 32. Integrator 40 comprises output capacitors 41 and 42, differential amplifier 43.

The differential input 11 comprises a terminal 16 to receive a negative referenced signal portion, labeled Vi−, of a differential signal, and a terminal 17 to receive a positive referenced signal portion, labeled Vi+, of the differential signal. Switch 21 comprises a first terminal connected to terminal 16, a second terminal, and a third terminal to receive a signal labeled So+e−. Capacitor 31 comprises a first terminal connected to the second terminal of switch 21 and a second terminal. Capacitor 31 is also labeled Ci+ to indicate it is an input, or sampling, capacitor. Switch 26 comprises a first terminal connected to the second terminal of the capacitor 31, a second terminal, and a third terminal to receive the signal labeled So+e−. Integrator 40 comprises a first differential input terminal connected to the second terminal of the switch 26, a second differential input terminal, a first differential output terminal, and a second differential output terminal, wherein, relative to each other, the first differential input terminal is the negative reference terminal, and second differential input terminal is the positive reference terminal, and the first differential output terminal is the positive reference terminal and the second differential output terminal is the negative reference terminal.

Switch 22 comprises a first terminal connected to terminal 17, a second terminal connected to the first terminal of the capacitor 31, and a third terminal to receive a signal labeled So−e+. Switch 27 comprises a first terminal connected to the second terminal of the capacitor 31, a second terminal connected to the second differential input terminal of the Integrator 40, and a third terminal to receive a signal labeled So−e+.

Switch 24 comprises a first terminal connected to terminal 16, a second terminal, and a third terminal to receive a signal labeled So−e+. Capacitor 32 comprises a first terminal connected to the second terminal of switch 24 and a second terminal. Capacitor 32 is also labeled Ci− to indicate it is an input, or sampling, capacitor. Switch 28 comprises a first terminal connected to the second terminal of the capacitor 32, a second terminal connected to the first differential input terminal of Integrator 40, and a third terminal to receive a signal labeled So−e+.

Switch 23 comprises a first terminal connected to terminal 17, a second terminal connected to the first terminal of the capacitor 32, and a third terminal to receive a signal labeled So+e−. Switch 29 comprises a first terminal connected to the second terminal of the capacitor 32, a second terminal connected to the second differential input terminal of the Integrator 40, and a third terminal to receive a signal labeled So+e−.

For purposes of discussion, an asserted signal received at the third terminal of a switch disclosed herein results in the switch being closed allowing a signal to propagate between the first and second terminals of the switch, and a negated signal received at the third terminal of a switch disclosed herein results in the switch being opened preventing a signal from propagating between the first and second terminals of the switch. The examples herein have chosen a high logic level, e.g., a "1", to be an asserted signal, and a low logic level, e.g., "0" to be a negated signal.

Figure 2:
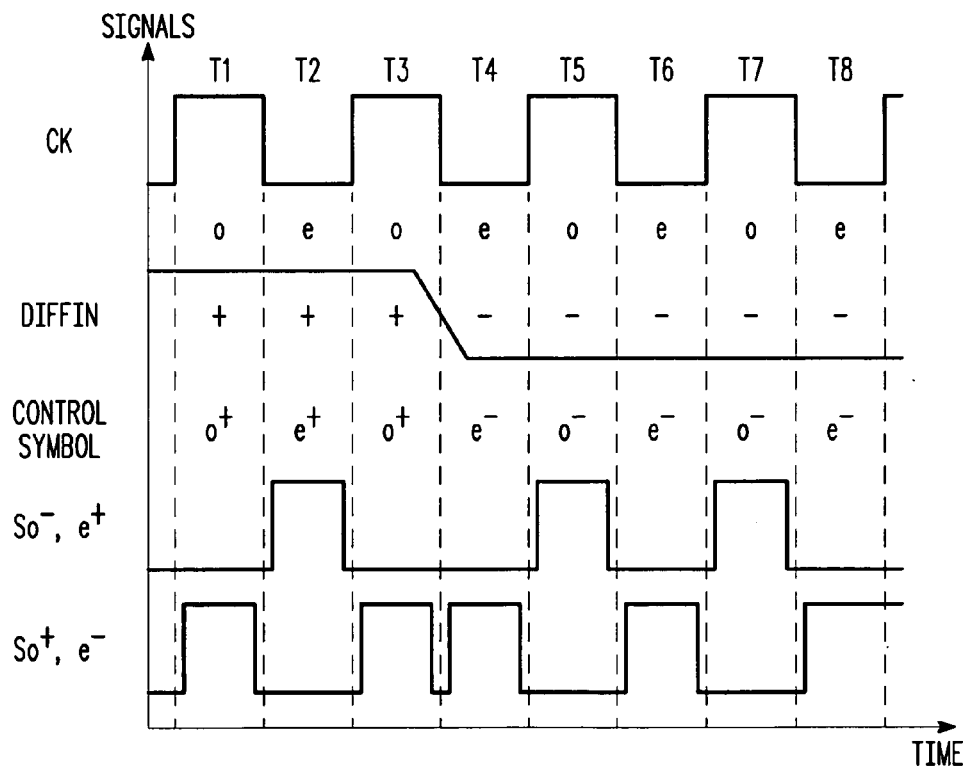
FIG. 2 is a timing diagram of signals in accordance with a specific embodiment.

FIG. 2 illustrates a timing diagram illustrating the relationship between various signals associated with the present disclosure. Specifically, a clock signal, CK, is used to generate an odd clock, CKODD, and an even clock, CKEVEN. In the embodiment illustrated, CKODD is in phase with the clock CK, and CKEVEN is approximately 180 degrees out of phase with CK. CKODD and CKEVEN are typically non-overlapping clocks with respect to each other. The signal labeled DIFFIN represents the polarity of the differential signal received at differential node 11.

The operation of each switch of FIG. 1 can be determined based upon the syntax of the control signal it receives. A switch that receives signal So−e+ is closed in response to one of two conditions being met. The first condition being when CKODD is being asserted, which also corresponds to CK being asserted, and a value of the differential input signal 11 is negative, e.g., Vi+−Vi−<0 volts. The second condition being when CKEVEN is being asserted, which also corresponds to CK being negated, and a value of the differential input signal 11 is positive, e.g., Vi+−Vi−>0 volts.

Likewise, a switch that receives signal So+e− is closed in response to one of two conditions being met. The first condition being when CKODD is being asserted and a value of the differential input signal 11 is positive. The second condition being when CKEVEN is being asserted and a value of the differential input signal 11 being negative, e.g., Vi+−Vi−<0 volts.

Figure 3:
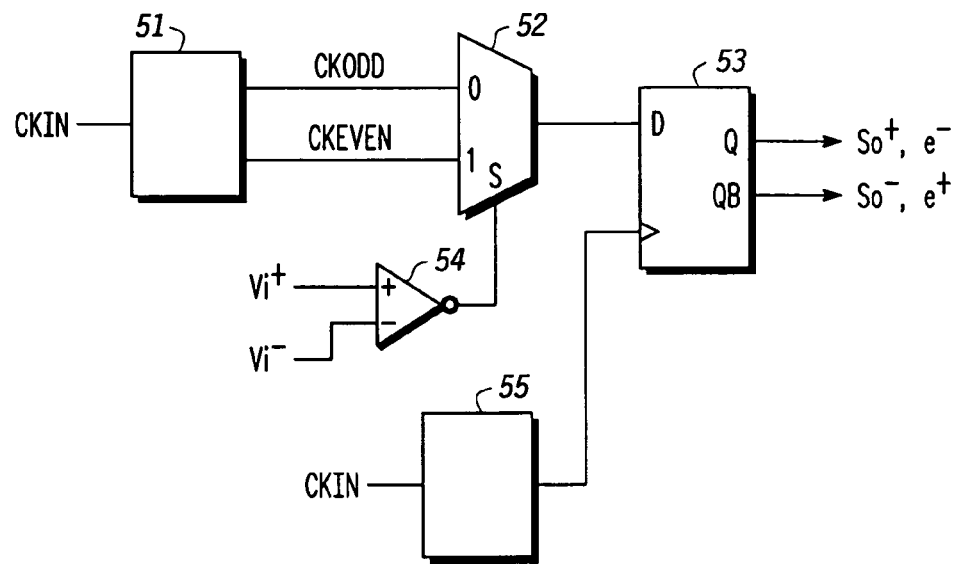
FIG. 3 is a block diagram of a switch control module to generate signals that control the switches of FIG. 1 in accordance with a specific embodiment

FIG. 3 illustrates, in block diagram form, a logical representation of a control module to provide separate clock signals for use as the odd and even clocks. A clock signal, CKIN, is received at a clock generator 51, which provides clock signals CKODD and CKEVEN, where CKODD is generally in phase with CK and CKEVEN is generally out of phase with CK. CKODD and CKEVEN are typically non-overlapping clocks. CKODD is provided to an input of a multiplexer that is selected by a low logic value control signal. CKEVEN is provided to an input of the multiplexer that is selected by a high logic value control signal. The control input of the multiplexer is connected to an output of a comparator 54, which determines a polarity of the differential input signal Vi. The output of multiplexer 52 is provided to a data input of a latch 53, illustrated specifically as a d-flip flop. A clocking node of the latch 53 is connected to a component 55 that receives CKIN and provides a clocking pulse to the latch 53 at the end of each time period T1–T10 of FIG. 8. The latch 53 provides control signals So−e+ and So+e−.

FIG. 2, illustrate how control signals So−e+ and So+e− are affected by the polarity of a differential input signal DIFFIN received at input 11. A system clock, labeled CK, is illustrated. Positive pulses are labeled with an "O" to indicate an odd clock, while negative pulses of CK are labeled with an "E" to indicate an even clock. DIFFIN is in a high state from time T1 through a portion of time T4. A "+" indicates the binary value of positive polarity for DIFFIN at the end of a clock cycle, while a "−" indicates the binary value of negative polarity for DIFFIN. DIFFIN is the value that will be stored on a sampling capacitor. The control syntax is listed to correspond to the FIG. 1, where during an odd clock only o+ and o− are referred to, and during an even clock, only $e^{30}$ and $e^{31}$ are referred to. This is advantageous over the prior art, in that it avoids a situation where on successive clock cycles the same voltage is sampled onto the same sampling capacitor at both inputs of the differential input, despite receiving nonzero differential input. For example, in the prior art, it is possible for an input sequence of . . . 1,−1,1,−1,1,−1 . . . to yield the same result as the input sequence . . . , 0,0,0,0,0 . . . because a $z^{-1}$ term based on the previous value of the input is represented in the integrator transfer function.

As illustrated by the values of So−e+ and So+e−, it is not possible to have the same voltage sampled onto the same sampling capacitor during successive clock cycles.

The function of the integrator system of FIG. 1 is further described by the equations below.

Referring back to FIG. 1 and assuming a 1-bit binary feedback is applied to the inputs, if the previous bit, i.e., the value at the differential input 11 during the previous clock, is the same as the current bit and is positive, then the function for the integrator system of FIG. 1 is given by:

$$C_0(V_o^+ - V_o^+ z^{-1}) = C_I^+ (V_I^+ z^{-1} - V_I^-)$$

$$C_0(V_o^- - V_o^- z^{-1}) = C_I^- (V_I^- z^{-1} - V_I^+)$$

Let $C_I = (C_I^+ + C_I^-)/2$ and $\Delta C_I = (C_I^+ - C_I^-)/2$. Then, $$C_0(V_o^+ - V_o^+ z^{-1}) = (C_I + \Delta C_I)(V_I^+ z^{-1} - V_I^-)$$

$$C_0(V_o^- - V_o^- z^{-1}) = (C_I - \Delta C_I)(V_I^- z^{-1} - V_I^{30})$$

Let $V_I^+ = V_R^+$ and $V_I^- = V_R^-$ be constants with $V_R = V_R^+ - V_R^-$, where $V_R$ is the voltage of the feed back signal. Then, $$C_0(V_o^+ - V_o^+ z^{-1}) = (C_I + \Delta C_I) V_R \quad (1)$$

$$C_0(V_o^- - V_o^- z^{-1}) = -(C_I - \Delta C_I) V_R \quad (2)$$

Subtracting equation 2 from equation 1 gives the differential-mode response $$C_0(V_o^+ - V_o^-)(1 - z^{-1}) = 2 C_I V_R. \quad (3)$$

If the previous bit is different from the current bit, or if the current bit is negative, then the integrator system function is given by the same equations.

In contrast to previously known methods, the integrator system of FIG. 1 has avoided introducing any hysteresis, as evidenced by the fact that equation 3 has no $z^{-1}$ term in the right-hand side. Its use in a sigma-delta modulator provides a double-sampling signal-delta modulator without hysteresis and without capacitor mismatch error. The two capacitor method illustrated in FIG. 1 does not correct for common-mode, therefore, a common mode correction circuit would typically be used in a sigma-delta converter utilizing the double-sampling technique illustrated.

Figure 4:
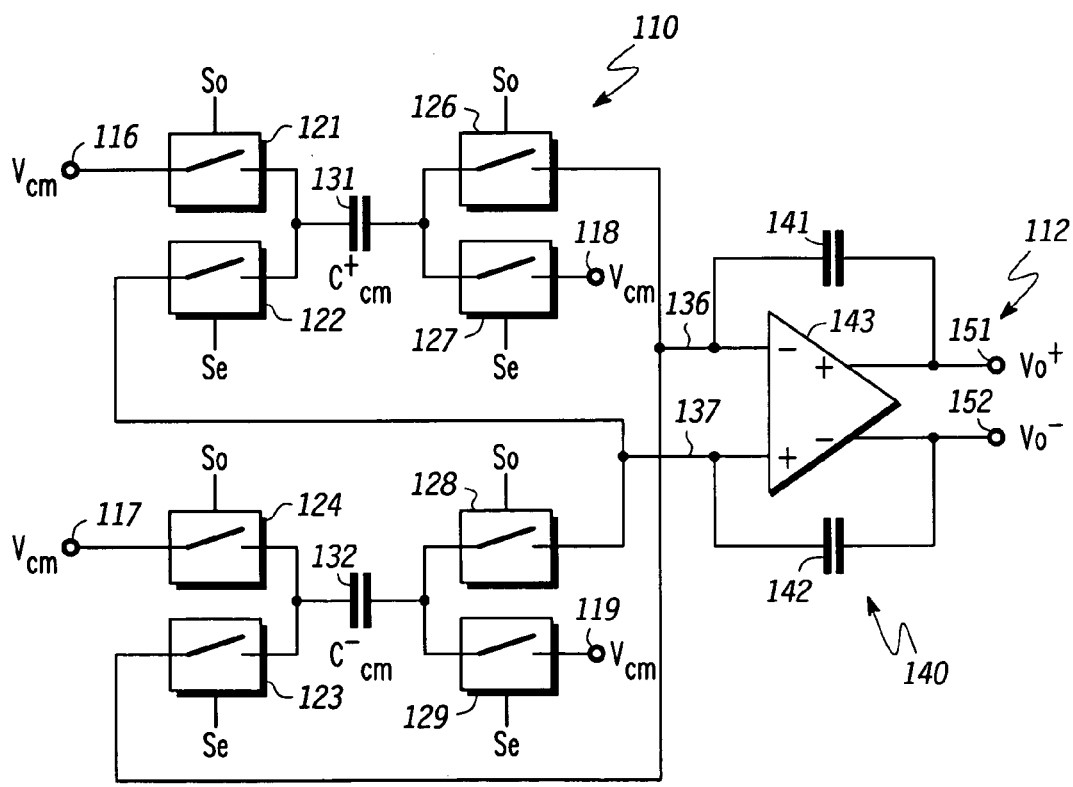
FIGS. 4, and 5 are block diagrams of an integrator system having a double-sampling common mode correction sampling module in accordance with a specific embodiment.

FIG. 4 illustrates a switched capacitor system that can be used in a stage of a sigma-delta converter. The switched capacitor system of FIG. 4 comprises differential feedback sampling portion 110 connected to integrator 140 by differential summing nodes 136 and 137. Not specifically illustrated in FIG. 4 is a differential input sampling portion that would typically be connected to the summing nodes 136 and 137. The switched capacitor system of FIG. 4 includes a common mode sampling portion 110 that comprises terminals 116–119, switches 121–124 and 126–129, and capacitors 131 and 132. The integrator portion 140 comprises output capacitors 141 and 142, integrator 140, and differential output 112.

The sampling circuit 110 performs a double-sampled common-mode correction. The circuit of FIG. 4 includes terminals 116-119 to receive a common-mode voltage signal Vcm. Switch 121 comprises a first terminal connected to terminal 116, a second terminal, and a third terminal to receive a signal labeled So. Capacitor 131 comprises a first terminal connected to the second terminal of switch 121 and a second terminal. Capacitor 131 is also labeled Ccm+ to indicate it is used to sample the common mode input. Switch 126 comprises a first terminal connected to the second terminal of the capacitor 131, a second terminal, and a third terminal to receive the signal labeled So. Integrator 140 comprises a differential amplifier 143 and capacitors 141 and 142. The differential amplifier includes first and second differential input terminal, and first and second output terminals 151 and 152 respectively. The first differential input terminal of the differential amplifier 143 is connected to the second terminal of the switch 126, wherein, relative to each other, the first differential input terminal is the negative reference terminal, and second differential input terminal is the positive reference terminal, and the first differential output terminal 151 is the positive reference terminal and the second differential output terminal 152 is the negative reference terminal. Switch 122 comprises a first terminal connected to the second differential input terminal of the differential amplifier 143, a second terminal connected to the first terminal of the capacitor 131, and a third terminal to receive the signal Se. Switch 127 comprises a first terminal connected to the second terminal of capacitor 131, a second terminal connected to the terminal 118 and a third terminal to receive signal Se. Switch 124 comprises a first terminal connected to the terminal 117, a second terminal, and a third terminal to receive signal So. Capacitor 132 comprises a first terminal connected to the second terminal of switch 124 and a second terminal. Capacitor 132 is also labeled Ccm− to indicate it is used to sample the common mode input. Switch 128 comprises a first terminal connected to the second terminal of the capacitor 132, a second terminal, and a third terminal to receive the signal labeled So. Switch 123 comprises a first terminal connected to the first differential input terminal of the differential amplifier 143, a second terminal connected to the first terminal of the capacitor 132, and a third terminal to receive the signal Se. Switch 129 comprises a first terminal connected to the second terminal of capacitor 132, a second terminal connected to the terminal 119 and a third terminal to receive signal Se.

The operation of each switch of FIG. 4 can be determined based upon the syntax of the signal it receives. A switch that receives signal So is closed in response to CKODD being asserted, which also corresponds to CK being asserted. A switch that receives signal Se is closed in response to CKEVEN being asserted, which also corresponds to CK being negated. The circuit of FIG. 4 implements a double-sampling method for common-mode correction using only two capacitors, rather than four in previously disclosed methods.

Figure 5:
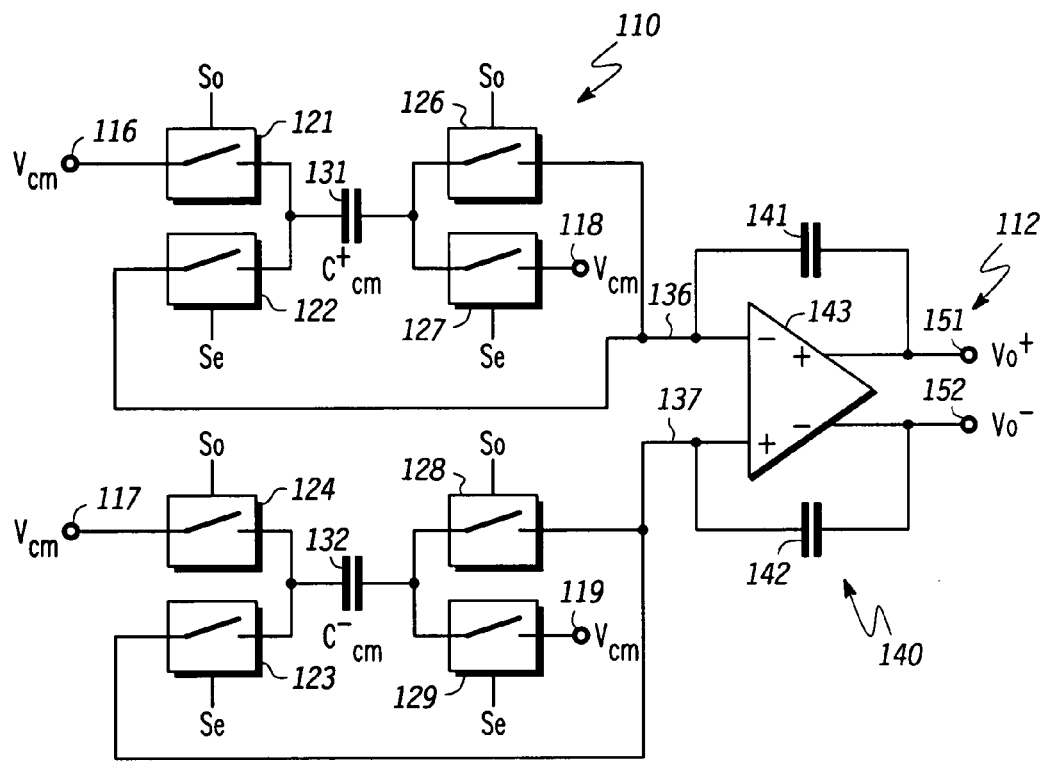

FIG. 5 illustrates an alternate embodiment of the switched capacitor system of FIG. 4, wherein the first terminal of the switch 122 is coupled to the second differential input terminal of the differential amplifier 143, instead of to the first differential input terminal of the differential amplifier 143. Similarly, the first terminal of the switch 123 is coupled to the second differential input terminal of the differential amplifier 143, instead of to the first differential input terminal of the differential amplifier 143.

Figure 6:
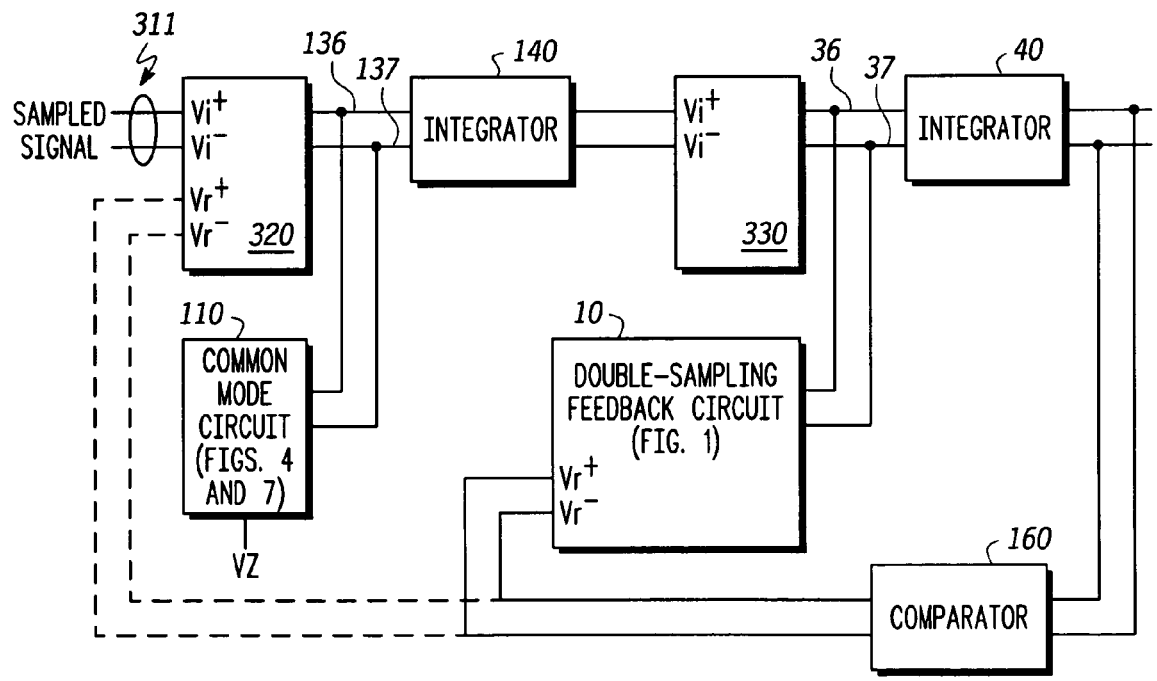
FIG. 6 is a block diagram of a sigma-delta converter having a double-sampling feedback sampling module and common-mode correction module in accordance with a specific embodiment.

FIG. 6 illustrates a two-stage sigma delta converter using the integrator systems of FIGS. 1 and 4. A differential signal to be sampled, e.g., Sampled Signal, is received at an input sampling module 320 that has a differential output coupled to the summing nodes 136 and 137 of the integrator system of FIG. 4. The output of integrator 140 is connected to the input of an input sampling circuit 330 that has its output coupled to the summing nodes 36 and 37 of the integrator system of FIG. 1. Feedback is provided from the output of integrator 40 through comparator 160 to the input of the double sampling feedback module 10 from the output of the integrator 40. The feedback is provided to the input sampling module 320 of the first stage of the sigma-delta converter. It will be appreciated that while a two-stage sigma-delta converter has been illustrated, that the integrator modules disclosed herein can be used with sigma-delta modulator have one stage, or more than two stages, or other architectures of two-stage sigma-delta modulators.

Figure 7:
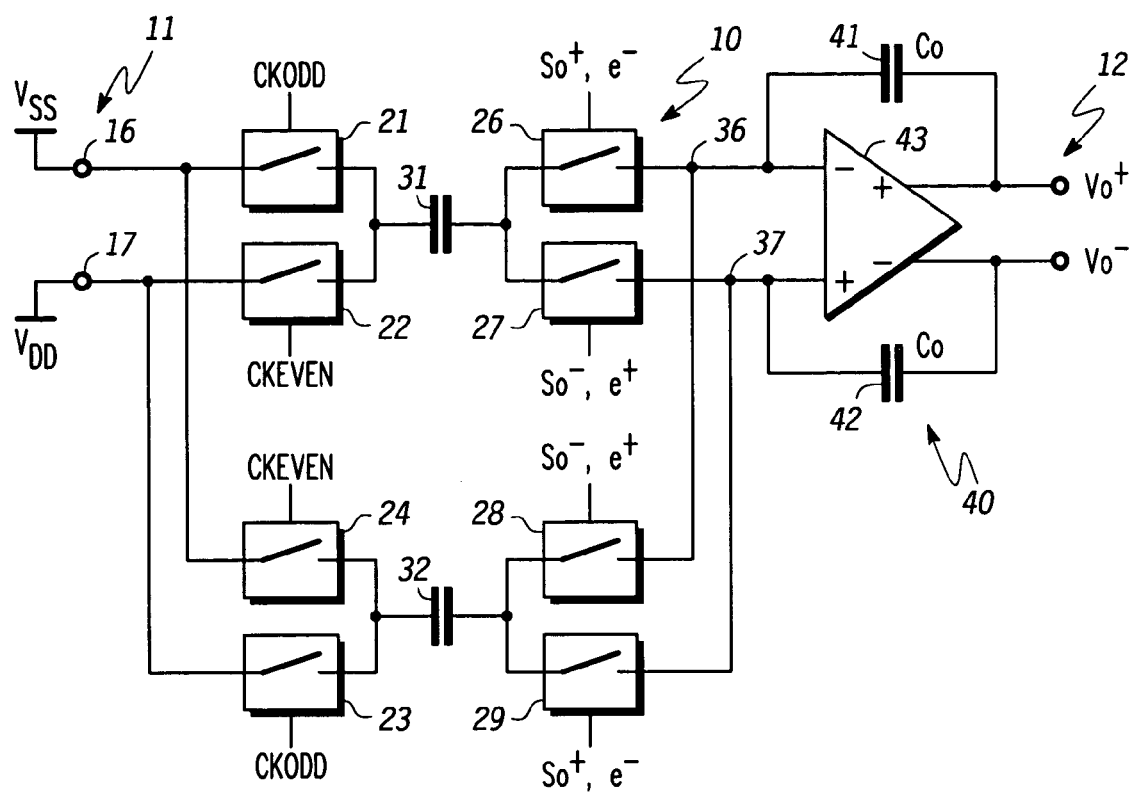
FIG. 7 is a block diagram of an integrator system having a double-sampling feedback sampling module in accordance with a specific embodiment.

FIG. 7 illustrates another embodiment of an integrator system similar to that of FIG. 1, where the feedback signal (Vr) is a binary value that is represented by two fixed voltages $V_{DD}$ and $V_{SS}$. The input portion between the input terminals 16 and 17 simplifies, wherein terminal 16 is connected to $V_{DD}$, terminal 17 is connected to $V_{SS}$, and the switches 21–24, are controlled by CKODD and CKEVEN directly.

In the preceding detailed description of the figures, reference has been made to the accompanying drawings which form a part thereof, and in which is shown by way of illustration specific embodiments in which the invention may be practiced. These embodiments are described in sufficient detail to enable those skilled in the art to practice the invention, and it is to be understood that other embodiments may be utilized and that logical, mechanical, chemical and electrical changes may be made without departing from the spirit or scope of the invention. To avoid detail not necessary to enable those skilled in the art to practice the invention, the description may omit certain information known to those skilled in the art. Furthermore, many other varied embodiments that incorporate the teachings of the invention may be easily constructed by those skilled in the art. For example, while odd and even clocks have been illustrated as relating to specific portions of a clock signal, it will be appreciated that the labels could also be reversed, in addition, a signal other than a feedback signal can be received at the differential input of FIG. 1. Accordingly, the present invention is not intended to be limited to the specific form set forth herein, but on the contrary, it is intended to cover such alternatives, modifications, and equivalents, as can be reasonably included within the spirit and scope of the invention. The preceding detailed description is, therefore, not to be taken in a limiting sense, and the scope of the present invention is defined only by the appended claims.

What is claimed is:

1. A method comprising:
monitoring a differential signal to determine a polarity of the differential signal, the polarity of the differential signal capable of being positive or negative; and
in response to the polarity of the differential signal being negative
coupling a first terminal of a first capacitive element to a first terminal of an integrator when the first terminal of a differential input is coupled to a second terminal of the first capacitive element; and
coupling the first terminal of the first capacitive element to a second terminal of the integrator when a second terminal of the differential input is coupled to the second terminal of the first capacitive element.

2. The method of claim 1, wherein a polarity of the differential signal is based on a differential signal provided by the integrator.

3. The method of claim 2, wherein the first terminal of the integrator is coupled to a negative input of a differential amplifier.

4. The method of claim 1, wherein coupling the first terminal of the differential input to the second terminal of the first capacitive element occurs during an active state of an even clock signal, and coupling the second terminal of the differential input to the second terminal of a first capacitive element occurs during the active state of an odd clock signal, the even clock signal and the odd clock signal being substantially mirrored representations of each other.

5. The method of claim 1 further comprising:
in response to the polarity of the differential signal being positive
coupling the first terminal of the first capacitive element to the second terminal of the integrator when the second terminal of the differential input is coupled to a second terminal of the first capacitive element; and coupling the first terminal of the first capacitive element to the first
terminal of the integrator when the first terminal of the differential input is coupled to the second terminal of the first capacitive element.

6. The method of claim 5, wherein the polarity of the differential signal is based on a differential signal provided by the integrator.

7. The method of claim 6, wherein the first terminal of the integrator is coupled to a negative input of a differential amplifier.

8. The method of claim 7, wherein coupling the first terminal of the differential input to the second terminal of the first capacitive element occurs during an active state of an odd clock signal, and coupling the second terminal of the differential input to the second terminal of a first capacitive element occurs during the active state of an even clock signal, the even clock signal and the odd clock signal being substantially mirrored representations of each other.

9. The method of claim 1 further comprising:
in response to the polarity of the differential signal being negative
coupling a first terminal of a second capacitive element to the first
terminal of the integrator when the first terminal of the differential input is coupled to a second terminal of the second capacitive element; and
coupling the first terminal of the first capacitive element to the second terminal of the integrator when the second terminal of the differential input is coupled to the second terminal of the second capacitive element.

10. The method of claim 9, wherein a polarity of the differential signal is based on a differential signal provided by the integrator.

11. The method of claim 10, wherein the first terminal of the integrator is coupled to a negative input of a differential amplifier.

12. The method of claim 9, wherein coupling the first terminal of the differential input to the second terminal of the second capacitive element occurs during an active state of an odd clock signal, and coupling the second terminal of the differential input to the second terminal of a second capacitive element occurs during the active state of an even clock signal, the even clock signal and the odd clock signal being substantially mirrored representations of each other.

13. The method of claim 9 further comprising:
in response to the polarity of the differential signal being positive
coupling a first terminal of the first capacitive element to the second terminal of the integrator when the second terminal of the differential input is coupled to a second terminal of the first capacitive element;
coupling the first terminal of the first capacitive element to the first terminal of the integrator when the first terminal of the differential input is coupled to the second terminal of the first capacitive element;
coupling the first terminal of the second capacitive element to the second terminal of the integrator when the second terminal of the differential input is coupled to a second terminal of the second capacitive element; and
coupling the first terminal of the second capacitive element to a first terminal of the integrator when the first terminal of the differential input is coupled to the second terminal of the second capacitive element.

14. A method comprising:
receiving a first portion of a first differential signal at a first terminal of a first capacitive element;
receiving a second portion of the first differential signal at a first terminal of a second capacitive element; and
coupling either the second terminal of the first capacitive element or the second terminal of the second capacitive element to a first input terminal of a differential amplifier based upon the polarity of the differential signal.

15. The method of claim 14, wherein coupling either the second terminal of the first capacitive element or the second terminal of the second capacitive element to a first input terminal of a differential amplifier is further based upon a polarity of a clock signal.

16. The method of claim 15, wherein receiving the first and second portions comprise the differential signal being a feedback signal based on an output signal from the differential amplifier.

17. The method of claim 16, wherein receiving the first and second portions comprise the feedback signal representing a binary value from a sigma delta converter.

18. The method of claim 15, wherein receiving the first and second portions comprise the first portion being a first predetermined fixed signal, and the second portion being a second predetermined fixed signal.

19. A method comprising:
determining a first value at a first terminal and a second value at a second terminal, where the first terminal and the second terminal are terminals of a different input; and
coupling a first sampling capacitor of a sigma-delta converter stage to one of a first integrator terminal and a second integrator terminal of an integrator of the sigma-delta converter stage based upon the first value and the second value.

20. The method of claim 19 further comprising receiving a clock comprising a first logic state and a second logic state, wherein coupling further comprises coupling the first sampling capacitor of the sigma-delta converter stage to one of the first integrator terminal and the second integrator terminal based upon a state of the clock.

21. The method of claim 19 wherein coupling the first sampling capacitor comprises the first sampling capacitor being in a feedback path including an output of the sigma-delta converter stage.

22. The method of claim 19 further comprising:
coupling a second sampling capacitor of the sigma-delta converter stage to one of the first integrator terminal and the second integrator terminal of the integrator upon the first value and the second value.

23. A sigma-delta converter stage comprising:
a differential input comprising a first terminal and a second terminal;
a first capacitive element comprising a first terminal and a second terminal;
a differential amplifier comprising a first input terminal and a second input terminal;
a first switch comprising a first terminal coupled to the first terminal of the first capacitive element and a second terminal coupled to the first terminal of the differential amplifier, and a control terminal;

a second switch comprising a first terminal coupled to the first terminal of the first capacitive element and a second terminal coupled to the second terminal of the differential amplifier, and a control terminal; and a control module comprising an input coupled to the differential input, a first output coupled to the control terminal of the first switch, and a second output coupled to the control terminal of the second switch, the first and second outputs to provide a control signals based upon a polarity of the differential input.

24. A method comprising:

connecting a first terminal of a first capacitor to a first input of a differential amplifier of an integrator in response to a clock signal being in a first state; and connecting the first terminal of the first capacitor to receive a signal in response to the clock signal being in a second state;

connecting a second terminal of the first capacitor to receive the signal in response to the clock signal being in the first state; and connecting the second terminal of the first capacitor to a second input of the differential amplifier in response to the clock signal being in the second state.

25. The method of claim 23 further comprising:

connecting a first terminal of a second capacitor to the second input of the differential amplifier in response to the clock signal being in the first state; and connecting the first terminal of the second capacitor to receive the signal in response to the clock signal being in the second state.

26. The method of claim 25 further comprising:

connecting a second terminal of the second capacitor to receive the signal in response to the clock signal being in the first state; and connecting the second terminal of the second capacitor to the first input of the differential amplifier in response to the clock signal being in the second state.

27. The method of claim 26 wherein the signal comprises a reference voltage.

28. The method of claim 27 wherein the reference voltage is common-mode rejection voltage reference.

29. An integration system comprising:

an integrator comprising a differential amplifier comprising a first differential input and a second differential input; and a first capacitor comprising a first terminal and a second terminal, the first terminal to be operably coupled to the first differential input of the differential amplifier in response to a clock signal being in a first state, and to be operably coupled to a signal in response to the clock signal being in a second state, the second terminal to be operably coupled to the signal in response to the clock signal being in the first state, and the second terminal to be operably coupled to one of the second differential input or the first differential input in response to the clock signal being in a second state;

a second capacitor comprising a first terminal and a second terminal, the first terminal to be operably coupled to the second differential input of the differential amplifier in response to a clock signal being in a first state, and to be operably coupled to a signal in response to the clock signal being in a second state, the second terminal to be operably coupled to the signal in response to the clock signal being in a first state, and the second terminal to be operably coupled to one of the first differential input, when the second terminal of the first capacitor is coupled to the second differential input, or the second differential input, when the second terminal of the first capacitor is coupled to the first differential input, in response to the clock signal being in a second state.

30. The integration system of claim 29 wherein the signal is a common-mode reference voltage.

* * * * *